(12) United States Patent
Su et al.

(10) Patent No.: US 7,977,160 B2
(45) Date of Patent: Jul. 12, 2011

(54) SEMICONDUCTOR DEVICES HAVING STRESS RELIEF LAYERS AND METHODS FOR FABRICATING THE SAME

(75) Inventors: Michael Su, Round Rock, TX (US);
Frank Kuchenmeister, Dresden (DE);
Lei Fu, Austin, TX (US)

(73) Assignee: GlobalFoundries, Inc., Grand Cayman (KY)

( * ) Notice: Subject to any disclaimer, the term of this patent is extended or adjusted under 35 U.S.C. 154(b) by 60 days.

(21) Appl. No.: 12/538,293

(22) Filed: Aug. 10, 2009

(65) Prior Publication Data
US 2011/0031603 A1 Feb. 10, 2011

(51) Int. Cl.
*H01L 21/00* (2006.01)
*H01L 23/495* (2006.01)
*H01L 29/40* (2006.01)
(52) U.S. Cl. .......................... 438/108; 257/669; 257/778
(58) Field of Classification Search .................. 257/669, 257/778; 438/108
See application file for complete search history.

(56) References Cited

U.S. PATENT DOCUMENTS

| 7,491,624 | B2* | 2/2009 | Lu et al. ..................... 438/455 |
| 7,776,651 | B2* | 8/2010 | Hua ............................. 438/109 |
| 7,879,455 | B2* | 2/2011 | Kajiwara et al. ............. 428/620 |
| 2004/0018660 | A1* | 1/2004 | Kim et al. .................... 438/108 |
| 2004/0183094 | A1* | 9/2004 | Caletka et al. ............... 257/178 |
| 2005/0035465 | A1* | 2/2005 | Miyasaka ..................... 257/778 |
| 2005/0173809 | A1* | 8/2005 | Yamamoto et al. ........... 257/780 |
| 2008/0174002 | A1* | 7/2008 | Chen et al. ................... 257/690 |
| 2010/0052189 | A1* | 3/2010 | Sakurai et al. ............... 257/778 |
| 2010/0207270 | A1* | 8/2010 | Yanase et al. ................ 257/737 |

* cited by examiner

*Primary Examiner* — Matthew C. Landau
*Assistant Examiner* — James M Mitchell
(74) *Attorney, Agent, or Firm* — Ingrassia Fisher & Lorenz, P.C.

(57) ABSTRACT

Methods are provided for fabricating a semiconductor device. In accordance with an exemplary embodiment, a method comprises the steps of providing a semiconductor die having a conductive terminal, forming an insulating layer overlying the semiconductor die, and forming a cavity in the insulating layer which exposes the conductive terminal. The method also comprises forming a first stress-relief layer in the cavity, forming an interconnecting structure having a first end electrically coupled to the first stress-relief layer, and having a second end, and electrically and physically coupling the second end of the interconnecting structure to a packaging substrate.

19 Claims, 11 Drawing Sheets

SEMICONDUCTOR DEVICES HAVING STRESS RELIEF LAYERS AND METHODS FOR FABRICATING THE SAME

FIELD OF THE INVENTION

The present invention generally relates to semiconductor devices and methods for fabricating semiconductor devices, and more particularly relates to semiconductor devices having stress relief layers, and methods for fabricating such semiconductor devices.

BACKGROUND OF THE INVENTION

A multitude of semiconductor devices are typically fabricated on a single semiconductor wafer substrate. Following a fabrication process sequence, individual devices or "die" are typically separated or "diced" from the substrate by sawing or laser scribing. These die are then incorporated within a packaging structure generally designed to seal the active area of the die and electrically interconnect device terminals with those of an external circuit. When devices are packaged using flip-chip bonding, solder beads or "bumps" often made of lead (Pb) or a lead alloy are reflowed and used to connect conductive terminals on the device to metal leads within the package. The active side of the device including the soldered interconnects is then encapsulated by an underfilling sealant that, when cured, provides an environmentally resistant barrier.

However, there is an ongoing effort by semiconductor device manufacturers to eliminate the use of many potentially hazardous materials including lead. Accordingly, other electrically conductive materials such as copper and copper alloys have been studied as potential replacements for lead-based solder interconnects. While copper interconnects have high electrical conductivity and improved mechanical strength compared with lead-based solders, copper is less ductile and thus is less able to absorb stress. As a result, shearing stresses between the packaging substrate and the surface of the die are often transferred by the relatively rigid copper interconnect to more brittle, back end of line (BEOL) and/or passivation layers within the die. Such stresses may be caused by, for example, a mismatch in the coefficient of thermal expansion (CTE) between the die and the packaging substrate, and can potentially fracture BEOL/passivation layers causing device failure. Therefore, an interconnecting structure capable of providing greater stress relief is desirable to prevent fracture of BEOL/passivation layers and improve the reliability of such devices.

Accordingly, it is desirable to provide semiconductor devices having a stress relief layer designed to absorb stress between a semiconductor die and a packaging substrate. Further, it is also desirable to provide methods for fabricating such semiconductor devices. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with exemplary embodiments of the invention, methods for fabricating a semiconductor device are provided. One exemplary method comprises providing a semiconductor die having a conductive terminal, forming an insulating layer overlying the semiconductor die, and forming a cavity in the insulating layer which exposes the conductive terminal. The method also comprises forming a first stress-relief layer in the cavity, forming an interconnecting structure having a first end electrically coupled to the first stress-relief layer, and having a second end, and electrically and physically coupling the second end of the interconnecting structure to a packaging substrate.

In accordance with another exemplary embodiment of the invention, a method of fabricating a semiconductor device is provided. The method comprises the steps of providing a semiconductor die having a first conductive terminal, providing a packaging substrate having a second conductive terminal, and forming a first stress-relief layer in electrical communication with the first conductive terminal. The method also comprises forming an interconnecting structure having a first end coupled to the first stress-relief layer, and having a second end, forming a second stress-relief layer on the second conductive terminal, and electrically and physically coupling the second stress-relief layer to the second end of the interconnecting structure.

In accordance with yet another exemplary embodiment of the invention, an electronic device is provided. The device comprises a packaging substrate, a semiconductor die having a conductive terminal, and a first stress-relief layer in electrical communication with the conductive terminal. The device also comprises an interconnecting structure having a first end electrically and physically coupled to the first stress-relief layer, and having a second end electrically and physically coupled to the packaging substrate.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

The various embodiments of the present invention illustrate semiconductor devices having a stress relief layer and describe methods for fabricating such semiconductor devices. The stress relief layer is disposed between a conductive terminal on a semiconductor die and an interconnecting structure used to electrically and mechanically couple the die to terminals within a packaging substrate. The stress relief layer is made of a ductile material that absorbs and relieves stresses between the die and packaging substrate that might otherwise be transferred to more brittle layers within the die, potentially causing these layers to fracture. Accordingly, the stress relief layer increases the reliability of such devices.

FIGS. 1-9 illustrate schematically, in cross-section, a semiconductor device and methods for fabricating a semiconductor device having a stress relief layer in accordance with an exemplary embodiment of the present invention. While the fabrication of one semiconductor device is illustrated, it will be appreciated that the methods depicted in FIGS. 1-9 can be used to fabricate any number of such devices. Various steps in the manufacture and packaging of semiconductor devices are well known and so, in the interest of brevity, many conventional steps will only be mentioned briefly herein or will be omitted entirely without providing the well known process details.

Figure 1:
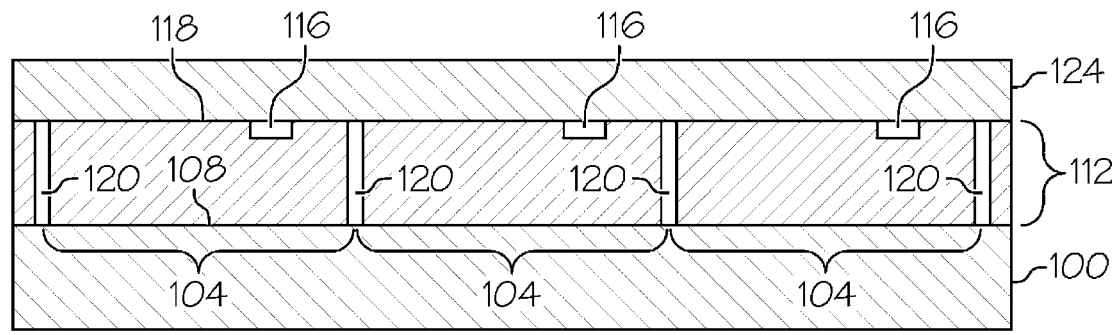
FIGS. 1-9 illustrate schematically, in cross-section, a semiconductor device and methods for fabricating a semiconductor device having a stress relief layer in accordance with an exemplary embodiment of the present invention.

Referring to FIG. 1, in accordance with an exemplary embodiment, these methods begin by providing a semiconductor substrate 100. The semiconductor substrate can be silicon, germanium, a III-V material such as gallium arsenide, or another semiconductor material. The semiconductor substrate may be a bulk wafer or may be of a layered configuration such as, for example, a semiconductor-on-insulator (SOI) structure comprising a thin layer of monocrystalline silicon on an insulating layer supported by a semiconductor carrier wafer.

A plurality of substantially identical individual semiconductor devices (or die) 104 are fabricated in and/or on and/or overlying a surface 108 of semiconductor substrate 100. While substrate 100 is illustrated as having three individual die, it is understood that any number of die may be fabricated on a single substrate depending upon the area of each die and that of the substrate. Each of die 104 includes any number of layers of different materials, such as semiconductor materials, dielectrics, and conductive metal layers, etc., used for the formation of a plurality of operational device features including, but not limited to, conductive traces, interconnecting plugs, conductive terminals, circuit elements, and the like. For simplicity and ease of description, these detailed layers are grouped collectively and depicted in the figures as BEOL (back end of line) layer 112. The different layers contained within BEOL layer 112 can be used to form individual active elements, e.g., transistors, diodes, electrical contacts, interlayer connections, and other features that are commonly found in semiconductor devices.

Each of die 104 includes at least one conductive terminal 116 disposed at an upper surface 118 of BEOL layer 112 and in electrical communication with any number and type of other components/features within layer 112. BEOL layer 112 also includes a plurality of scribe grid regions 120 that circumscribe the periphery of each of die 104 providing a sacrificial region through which individual die may be diced. BEOL layer 112, including conductive terminal 116, is blanket capped by at least one protective, non-conducting passivation layer 124 comprising a dielectric material such as, for example, a silicon oxide or a silicon nitride overlying surface 118. Passivation layer 124 may be deposited, for example, by a plasma-enhanced chemical vapor deposition (PECVD) process using silane ($SiH_4$) and either nitrous oxide ($N_2O$) or oxygen ($O_2$) to form a silicon oxide layer, or by using $SiH_4$ and ammonia ($NH_3$) or nitrogen ($N_2$) in the presence of an argon (Ar) plasma to form a silicon nitride layer. Layer 124 may also be deposited using low pressure chemical vapor deposition (LPCVD) using tetraethyl orthosilicate (TEOS: $Si(OC_2H_5)_4$), or dichlorosilane ($SiH_2Cl_2$) and $N_2O$ to form a silicon oxide layer. In one embodiment, passivation layer 124 has a thickness of from about 50 nanometers (nm) to about 5 microns (μm), and preferably is about 1.2 μm thick.

Figure 2:
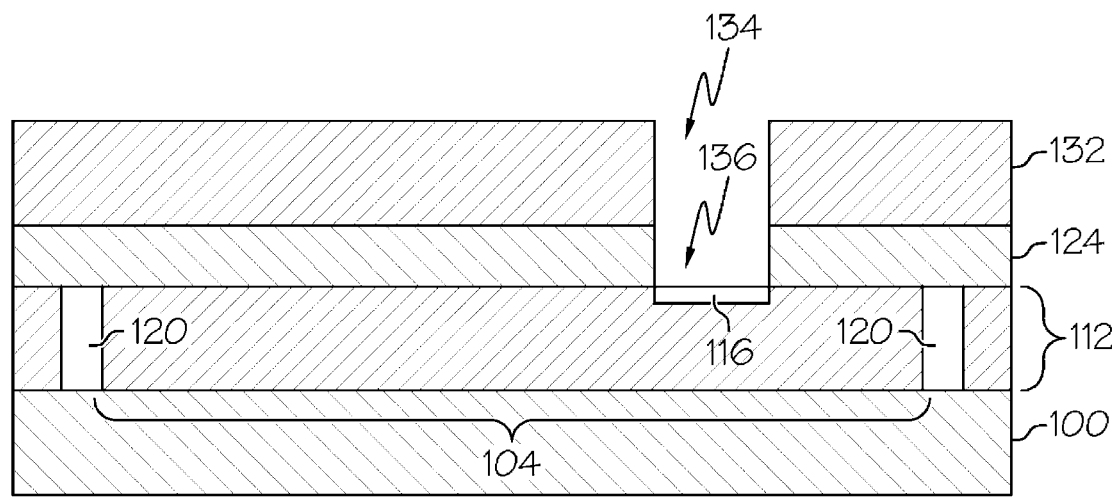

Because each of the die 104 on substrate 100 receives the same processing steps, for the sake of clarity, these steps will hereinafter be described and illustrated in the context of a single die 104, as illustrated in FIG. 2. A masking layer 132 is formed overlying passivation layer 124 and is patterned using a lithographic process to form an opening 134 aligned with conductive terminal 116. Next, passivation layer 124 is etched using layer 132 as an etch mask to form an opening 136 through layer 124 that provides access to conductive terminal 116. This etch may optionally be performed anisotropically, and is selective to passivation layer 124 so as to stop on, or remove only negligible amount of, conductive terminal 116. This etch may be performed by, for example, a reactive ion etch (RIE) process using chemistries based upon carbon trifluoride/oxygen ($CHF_3/O_2$) to etch silicon nitride, and $CHF_3$ or carbon tetrafluoride ($CF_4$) to etch silicon oxynitride or silicon oxide. Depending upon etch selectivity and the thickness of passivation layer 124, masking layer 132 may be either a soft photoresist mask or a hard mask that has been patterned using a soft masking/etching process sequence. Masking layer 132 then is removed.

Figure 3:
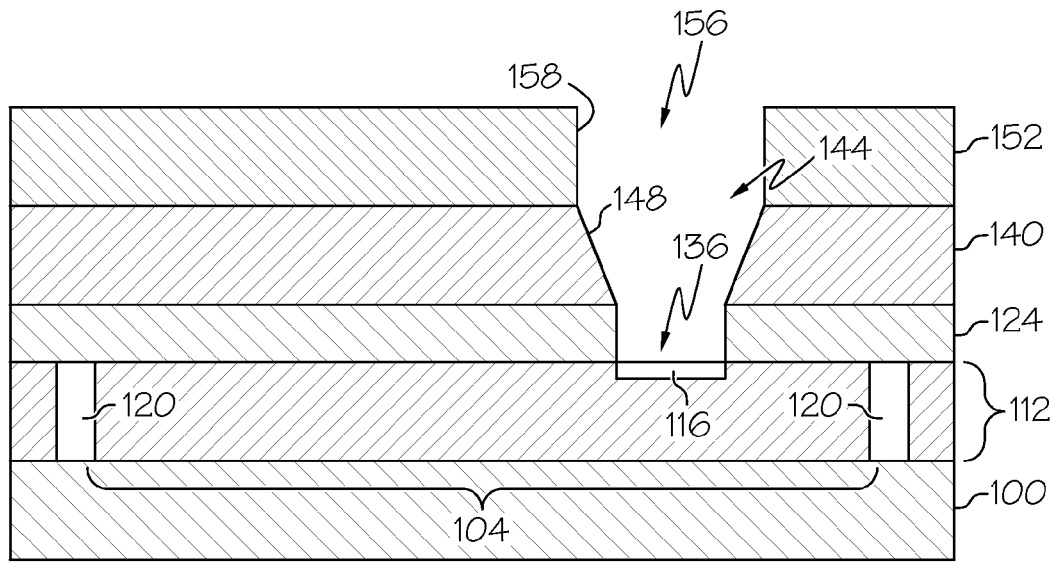

The method continues, as illustrated in FIG. 3, with the blanket coating of a pillar forming layer 140 overlying passivation layer 124 and conductive terminal 116. Layer 140 will be patterned to provide a cavity into which a stress-relief layer and an interconnecting structure, each described more fully below, will be formed by electroplating, and thus is an electrically insulating material such as, for example, benzocyclobutene (BCB), a polyimide, or a suitable derivative of a polyimide. In one embodiment, pillar forming layer 140 is a polyimide that may be applied, for example, via a spin coating and post application bake sequence. Layer 140 has a thickness that may depend upon factors that include the dimension of conductive terminal 116 and/or the thickness of the subsequently formed stress relief layer. In one embodiment, pillar forming layer 140 has a thickness of from about 50 nm to about 5 μm. Pillar forming layer 140 then is patterned to form an opening 144 aligned with conductive terminal 116 and opening 136. Layer 140 may be patterned, for example, by a lithography and etch process sequence that may include a hard mask layer if needed. In a preferred embodiment, pillar forming layer 140 comprises a negative or positive acting photosensitive polyimide that is patterned using a lithographic exposure followed by immersion in a developer. For example, layer 140 may comprise a photosensitive polyimide such as HD 4004 (available from HD Microsystems) that is lithographically exposed using ultra violet (UV) irradiation through a photomask, and patterned following exposure by immersion in a cyclopentanone-based developer. Opening 144 has sidewalls 148 that may assume any desired contour including straight-walled or sloped (as illustrated).

Next, a pillar forming layer 152 is applied overlying pillar forming layer 140. Pillar forming layer 152 may be any of the materials described above with reference to layer 140. In one embodiment, pillar forming layer 152 is a photosensitive polyimide that is patterned using a lithographic exposure and development sequence to form an opening 156 aligned with openings 144 and 136, and conductive terminal 116. Layer 152 provides added depth to the cavity formed by openings 144 and 136 in which an interconnecting structure will be subsequently formed, and provides resiliency between this interconnecting structure and BEOL layer 112 helping to absorb and mitigate stresses that, when die 104 is subsequently packaged, may cause brittle fracture within BEOL layer 112 and/or passivation layer 124. Accordingly, layer 152 has a thickness consistent with these considerations and depending, at least in part, upon the desired height of the interconnecting structure. Further, opening 156 may optionally be wider than opening 144 to enable an increase in the width of this interconnecting structure. For example, layer 152 has a thickness of from about 500 nm to about 30 µm, and preferably is about 4 µm thick. Opening 156 has sidewalls 158 that may be either substantially straight-walled (as illustrated) or sloped.

Figure 4:
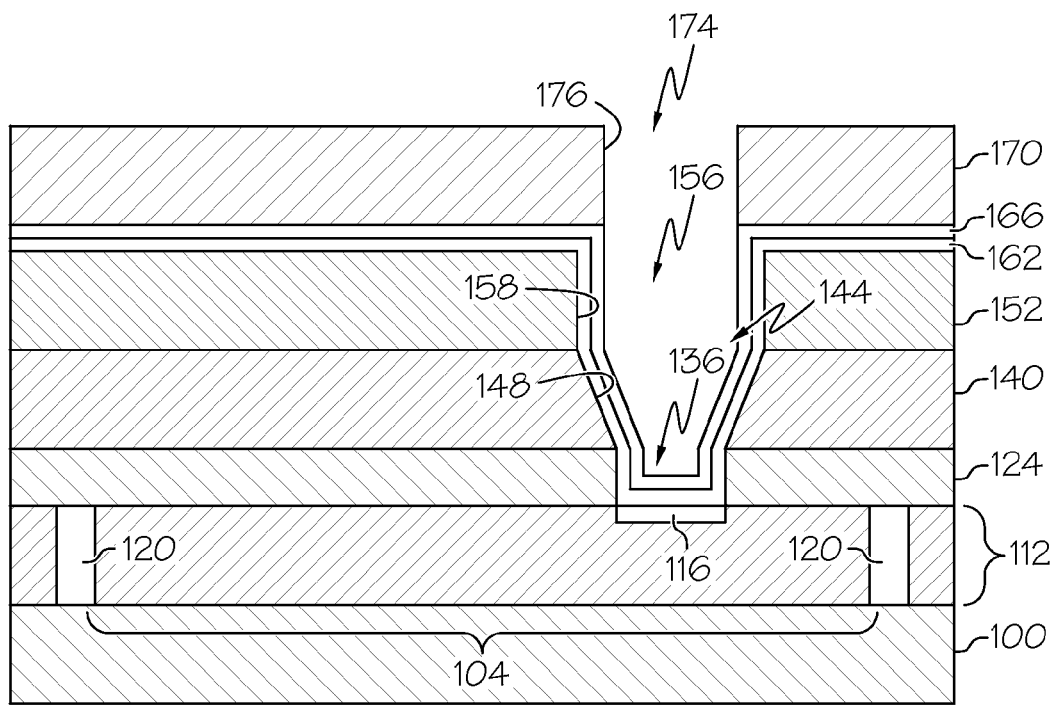

Referring to FIG. 4, a barrier layer 162 is blanket deposited overlying each of the exposed surfaces of die 104 including pillar forming layer 152, sidewalls 148 and 158 of pillar forming layers 140 and 152, respectively, the side surfaces of opening 136, and conductive terminal 116. Barrier layer 162 is physically and electrically coupled to terminal 116, and provides a diffusion barrier that prevents subsequently-deposited copper from migrating into pillar forming layer 152. Layer 162 may comprise any conductive metal suitable as such a barrier including, titanium (Ti), titanium nitride (TiN), tantalum (Ta), tantalum nitride (TaN), tantalum silicon nitride (TaSiN), titanium tungsten (TiW), chromium copper (CrCu), or any combination of these such as, for example, TaN/Ta or TiW/Cr/Cu, and preferably is Ti. Layer 162 may be deposited using a CVD or preferably a physical vapor deposition (PVD) process such as, for example, sputtering or ionized physical vapor deposition (IPVD). Layer 162 has a thickness consistent with providing a continuous barrier structure. In one embodiment, layer 162 has a thickness of from about 50 nm to about 500 nm, and preferably is about 100 nm thick.

Next, a seed layer 166 is blanket deposited overlying barrier layer 162 using any deposition methodology described above with reference to layer 162. Seed layer 166 preferably comprises Cu, and forms an electrically continuous conductive film having a thickness sufficient for carrying the current necessary for subsequent electroplating processes. In one embodiment, layer 166 has a thickness of from about 100 nm to about 1 µm, and preferably is about 200 nm thick. A pillar forming masking layer 170 then is applied overlying seed layer 166, and is patterned using a lithography process to form an opening 174 aligned with openings 144 and 156. Opening 174 has sidewalls 176 that may have any contour such as sloped or preferably substantially straight-walled (as illustrated). Layer 170 is a non-conductive material having a thickness sufficient to further extend the height of the cavity created by openings 136, 144, and 156. This thickness will at least partially depend on the height of the subsequently formed interconnecting structure and the desired gap between die 104 and a packaging substrate to be described more fully below. In one embodiment, layer 170 comprises a positive or negative acting thick film photoresist having a thickness of from about 20 µm to about 150 µm, and preferably is from about 70 µm to about 75 µm thick. Because layer 170 is non-conducting, it prevents the deposition of electroplated metal on seed layer 166 during subsequent electroplating processes except within opening 174 where such metal layer formation is desired.

Figure 5:
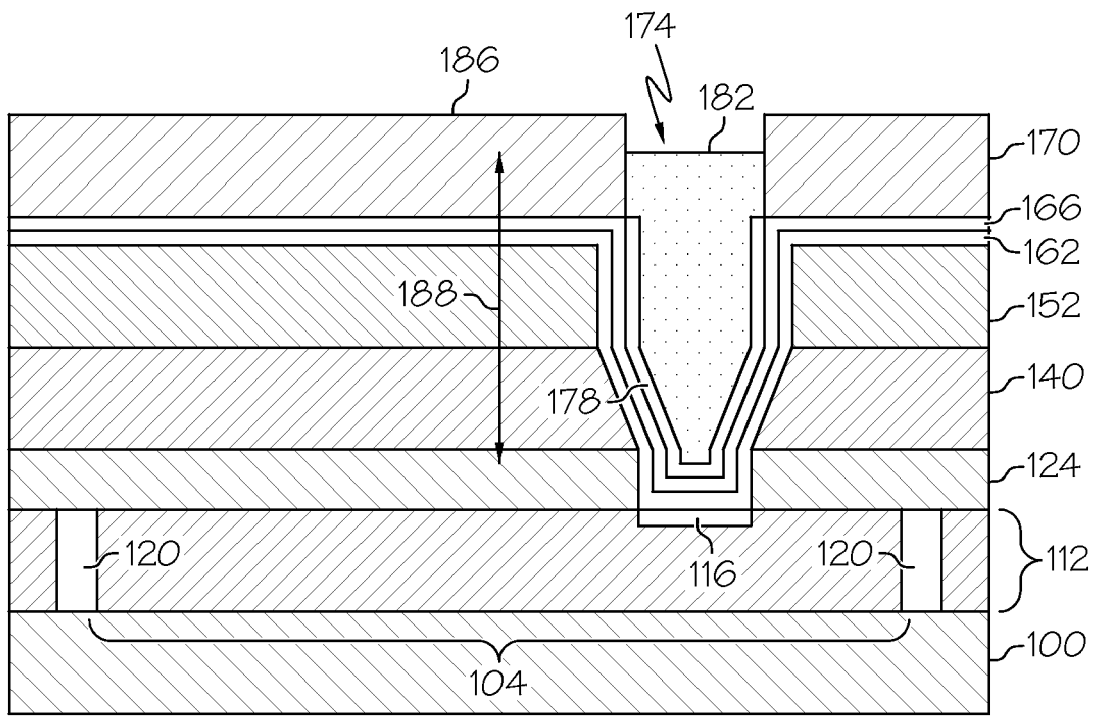

A stress relief layer 178 is deposited overlying seed layer 166 using an electroplating process, as illustrated in FIG. 5. Stress relief layer 178 may comprise any conductive material having a ductility greater than that of substantially pure copper, or having a shear modulus that is less than about $6.5 \times 10^6$ pounds per square inch (psi). For example, stress relief layer 178 may comprise a lead-based eutectic composition, or may comprise tin (Sn), silver (Ag), indium (In), bismuth (Bi), zinc (Zn), gold (Au), nickel (Ni), magnesium (Mg), aluminum (Al), and any alloys thereof. Layer 178 may also include Cu as an alloying element with any of the above elements provided the criterion relating to shear modulus described above is met. Because electroplating is used in the formation of layer 178, only conducting surfaces on die 104 in electrical communication with an anode through the electroplating bath, such as that of seed layer 166 within opening 174, are plated. Layer 178 has a thickness sufficient for absorbing stress between die 104 and the packaging substrate described below, and depends at least in part on the material chosen for this layer. In one embodiment, stress relief layer 178 has a thickness of from about 500 nm to about 20 µm, and preferably is from about 1 µm to about 5 µm thick.

Next, a pillar structure 182 is formed within opening 174 and overlying stress relief layer 178. Pillar structure 182 comprises a conductive material such as, for example, Cu or Cu alloyed with Au, Ag, Zn, and/or Mg. Preferably, structure 182 comprises Cu and is formed using an electroplating process. Accordingly, as described above with reference to layer 178, pillar structure 182 is only formed overlying conductive surfaces that are exposed to the plating bath including surfaces within opening 174 and not, for example, on a surface 186 of pillar forming masking layer 170. The height of pillar structure 182 (as represented by doubled headed arrows 188) is selected to extend above the surface of die 104 by a sufficient amount to provide the desired gap between die 104 and the packaging substrate to be coupled thereto. Accordingly, layer 170 has a thickness sufficient such that pillar structure 182 is contained within opening 174 and does not extend beyond layer 170 so that mushrooming of structure 182 is prevented. In one embodiment, pillar structure 182 has a height of from about 10 µm to about 200 µm, and preferably is from about 40 µm to about 80 µm in height.

Alternatively, in another embodiment (not illustrated), stress relief layer 178 is blanket deposited overlying passivation layer 124, and in contact with conductive terminal 116 following the formation of opening 136. Stress relief layer 178 then is removed in all regions except overlying conductive terminal 116 by lithographically forming a soft or hard mask overlying terminal 116 followed by a wet or dry etch that removes layer 178 elsewhere. Following the formation of stress relief layer 178, pillar forming layers and seed layers, as described above, are applied/deposited in preparation for the formation of pillar structure 182.

Figure 6:
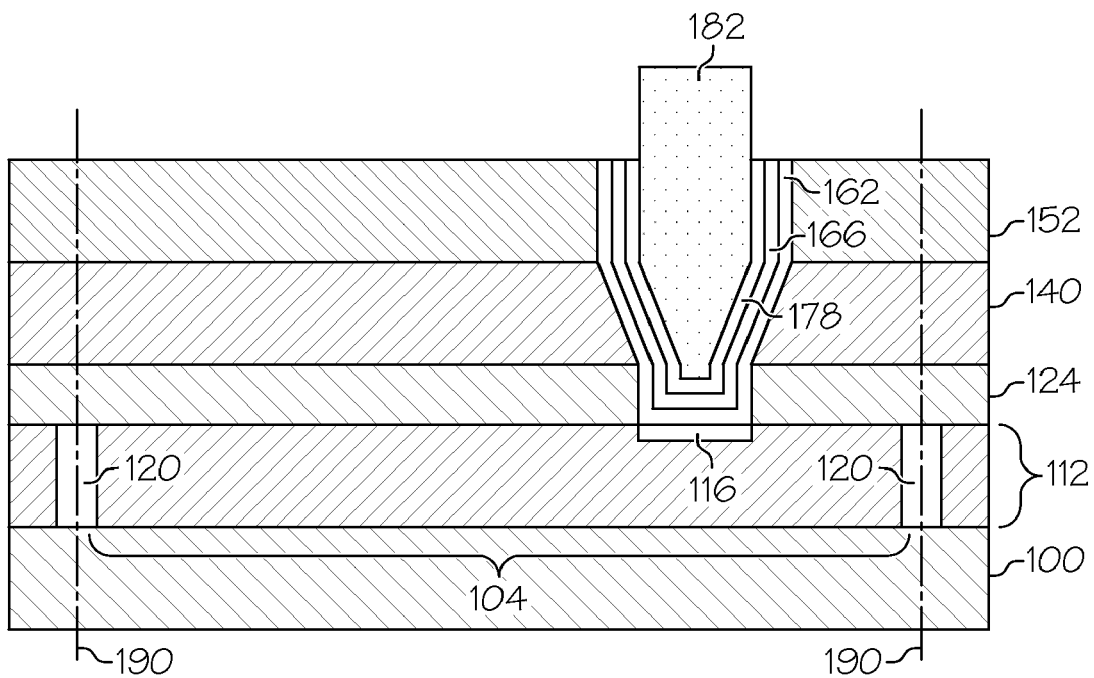

Pillar forming masking layer 170 then is removed, preferably using a solvent-based stripper, as illustrated in FIG. 6. Barrier and seed layers 162 and 166 are also removed from pillar forming layer 152 except proximate the sides of pillar structure 182. Layers 162 and 166 may be removed using either wet or dry etch processes. For example, with reference to layer 162, Ti or TiN may be wet etched using dilute aqueous hydrofluoric acid (HF), and Ta or TaN may be etched using a mixture of HF and ammonium fluoride ($NH_4F$). With reference to layer 166, Cu may be wet etched using a mixture of aqueous sulfuric acid ($H_2SO_4$) and hydrogen peroxide ($H_2O_2$). Any of the metals used in either of layers 162 and 166 may be dry etched using chemistries based upon $CF_4/O_2$, sulphur hexafluoride ($SF_6$)/$O_2$, or $CHF_3/O_2$. Substrate 100 is then diced through scribe regions 120 along dotted lines 190 to singulate die 104 using a sawing or laser scribing process.

Figure 7:
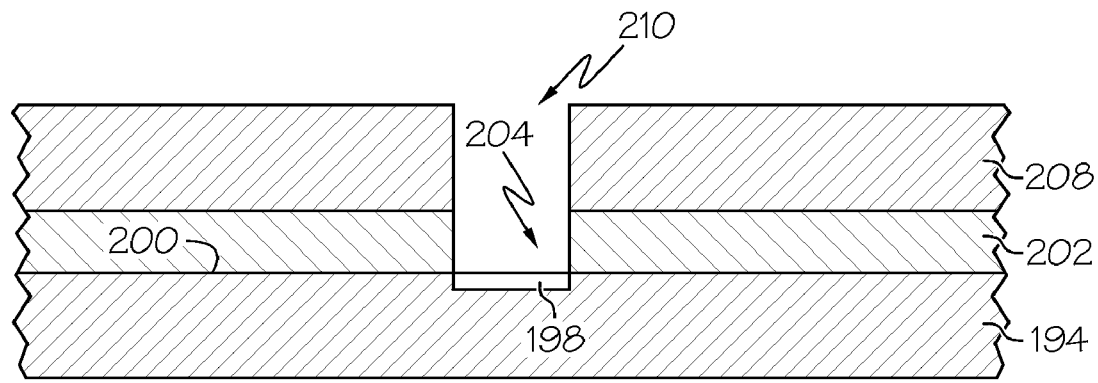

Next, a packaging substrate 194 is prepared for electrical and mechanical coupling to die 104 using a flip-chip bonding process, as illustrated in FIG. 7. Substrate 194 has a laminar structure containing various conductive and insulating layers and includes a conductive terminal 198 disposed at a surface 200 configured to be coupled to pillar structure 182 (FIG. 6). A solder masking layer 202 is deposited overlying surface 200, including terminal 198. Layer 202 may be any non-conducting material suitable as a solder mask through which a conducting stress relief layer, to be described below, may be deposited. An opening 204 is formed in layer 202 that is aligned with and provides electrical access to conductive terminal 198 using a lithography and etch process sequence. In one embodiment, layer 202 is a positive or negative acting photosensitive polyimide of the type described above with reference to pillar forming layer 140, and opening 204 is created using an exposure and development process. The thickness of layer 202 depends at least partially on the thickness of the subsequently formed stress relief layer, and preferably has a thickness that ranges from about 500 nm to about 10 μm. A solder masking layer 208 is applied overlying layer 202 including terminal 198. In one embodiment, layer 208 is a positive or negative acting thick film photoresist that is patterned to form an opening 210 overlying terminal 198 and aligned with opening 204.

Figure 8:
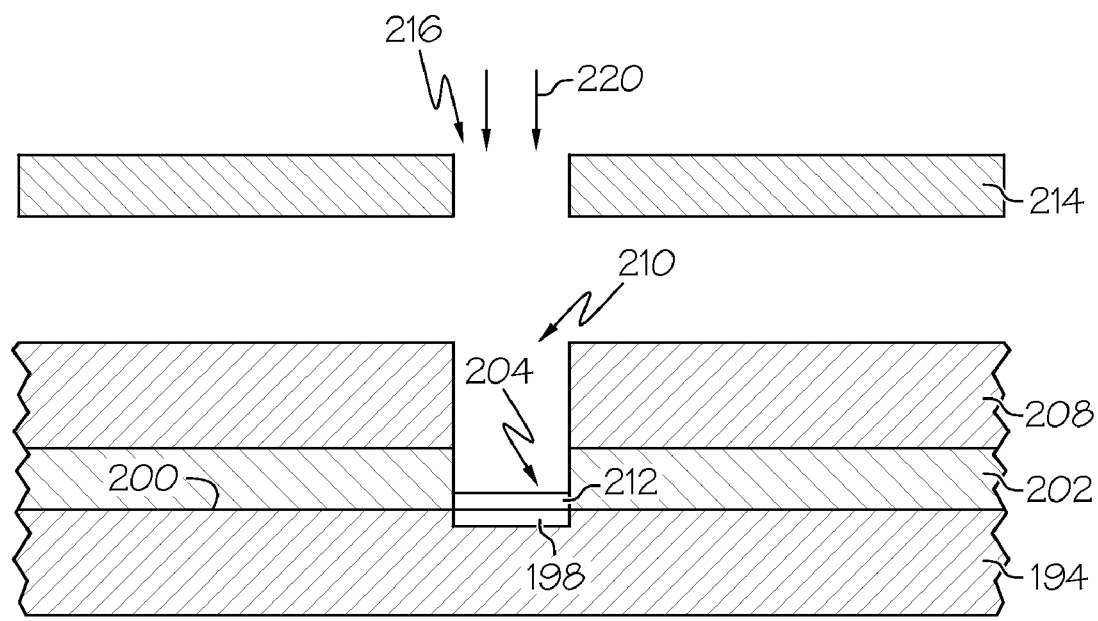

Next, a stress relief layer 212 is formed on conductive terminal 198 using a stencil mask printing process, as illustrated in FIG. 8. Stress relief layer 212 may comprise any of the materials described above with reference to stress relief layer 178, but has a sufficiently low melting temperature to be compatible with subsequent stencil printing and solder bonding processes described below. A stencil mask 214 having an opening 216 sized in accordance with the dimensions of conductive element 198 is brought into proximity with and aligned to openings 204 and 210, and conductive terminal 198. The material to be used for layer 212 then is printed (as represented by arrows 220) through opening 216, 210, and 204 and bonded to conductive terminal 198.

Figure 9:
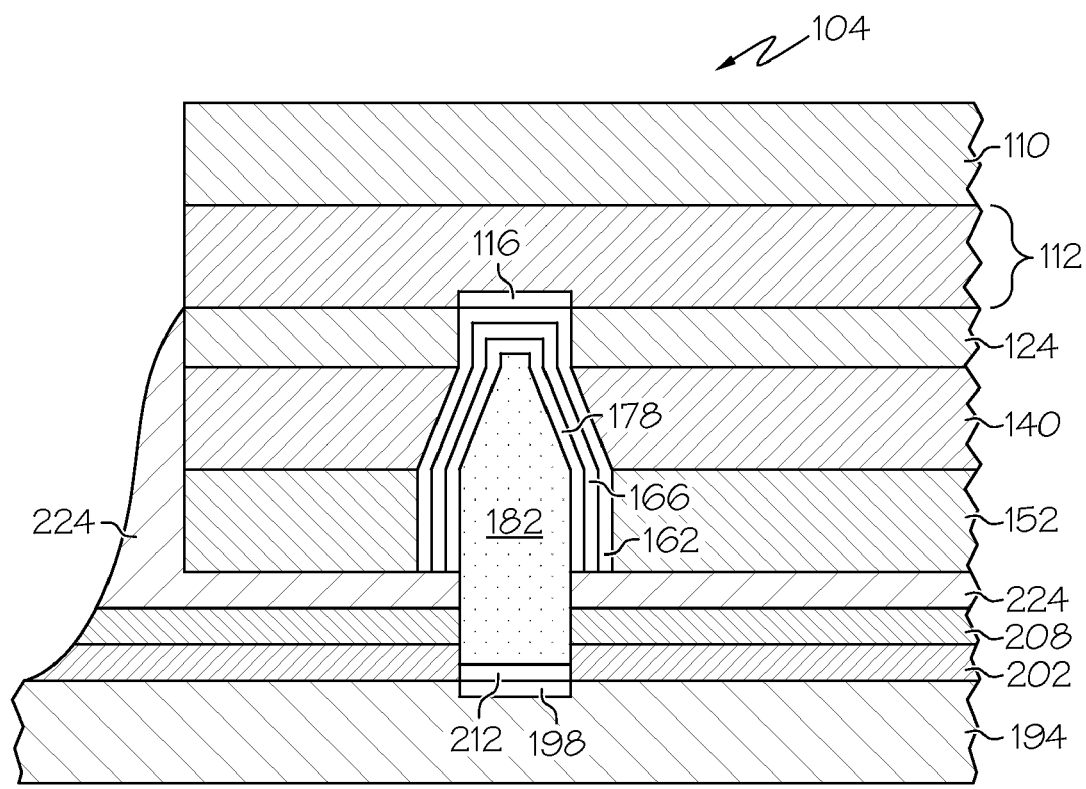

Die 104 then is inverted and bonded to packaging substrate 194 using a flip-chip bonding process, as illustrated in FIG. 9. Because the details pertaining to flip-chip bonding processes are well known, only a portion of die 104 is shown, and only those details that pertain to the invention will be discussed in detail. Pillar structure 182 is aligned through openings 204 and 210 to contact stress relief layer 212. Packaging substrate 194 then is heated so that layer 212 reflows and solder-bonds to pillar structure 182. Next, an underfilling sealant 224 comprising an electrically-insulating adhesive material such as, for example, Hitachi 3730 (available from Hitachi Inc., Tokyo Japan), Shin-Etsu SMC375TE-T12 (Shin-Etsu Chemical Co., Tokyo Japan), Namics 2BD or Namics 119 (Namics Corp., Niigata City, Japan) is injected between solder masking layer 208 and pillar forming layer 152. Underfilling sealant 224 flows by capillary forces between these layers and fills gaps between pillar structure 182 and other pillar structures (not illustrated) used to couple die 104 to substrate 194. Underfilling sealant 224 then is hardened using a baking process to enhance adhesive bonding to layers 152 and 208, and provide a moisture resistant environmental seal for the packaged die.

Figure 10:
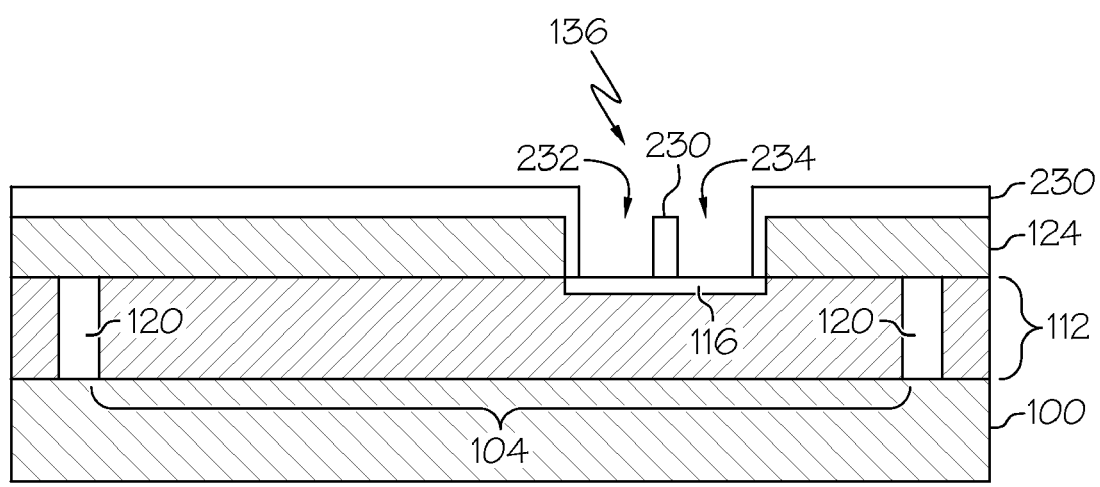
FIGS. 10-18, in conjunction with FIGS. 1-2, illustrate schematically, in cross-section, a semiconductor device and methods for fabricating a semiconductor device having a stress relief layer in accordance with another exemplary embodiment.

In another exemplary embodiment illustrated in FIGS. 10-18 in conjunction with FIGS. 1-2, a metallic stress relief layer is combined with an embedded patterned organic layer. The embedding of an organic layer into the stress relieving metal layer provides additional capacity for energy absorption and stress relief through plastic deformation within these layers that helps to prevent more brittle layers within the die from fracturing. This method begins with steps that are illustrated in FIGS. 1-2, and previously described. Following the removal of masking layer 132, an embedded organic layer 230 comprising any of the materials previously described with reference to pillar forming layer 140 is applied as a blanket film over the surface of passivation layer 124 and within opening 136, as illustrated in FIG. 10. Embedded organic layer 230 then is patterned in the region within opening 136 to form one or more openings that provide access to conductive terminal 116. Layer 230 may be patterned using a lithography and etch process sequence or, in a preferred embodiment, layer 230 comprises a photosensitive polyimide patterned using an exposure and development process. In regions of die 104 outside of opening 136, layer 230 may be removed during the development process or, optionally, may remain (as illustrated).

Figure 11:
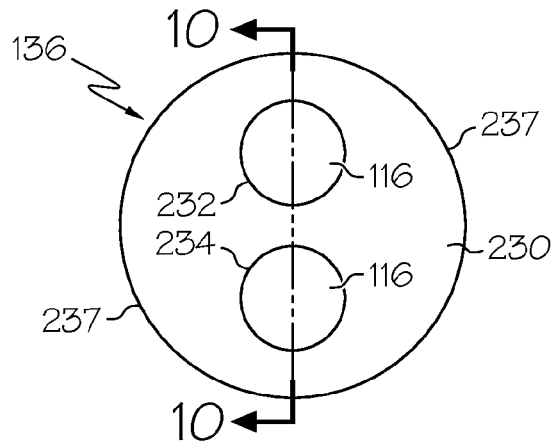
Figure 12:
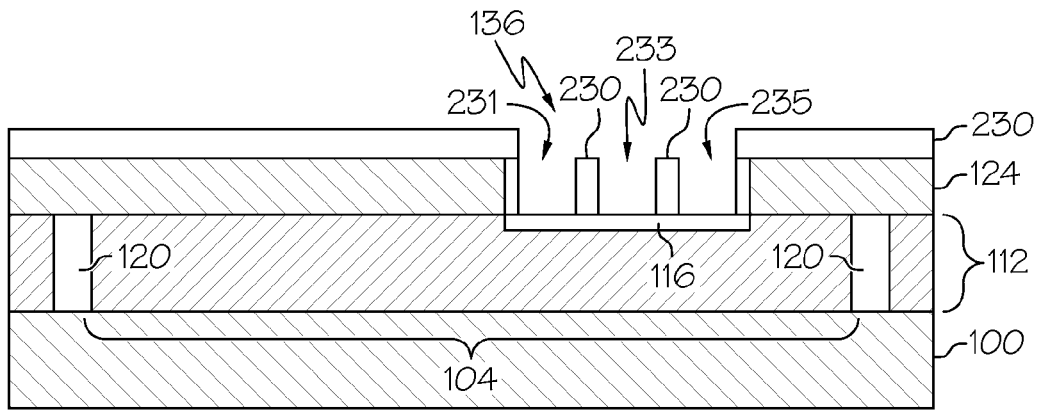
Figure 13:
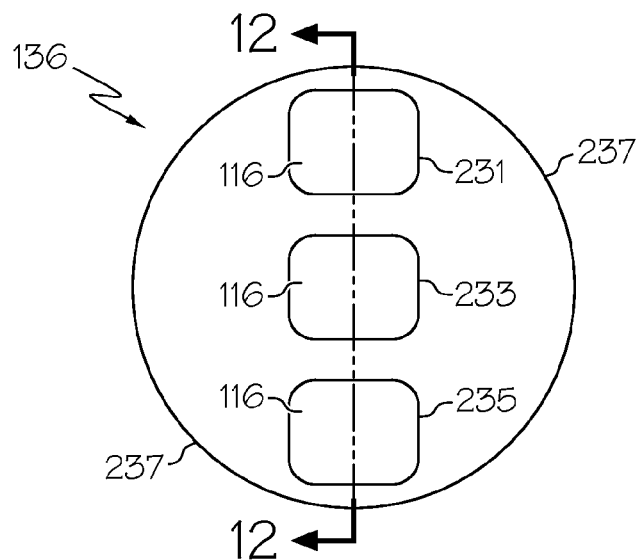

The pattern design for layer 230 overlying conductive terminal 116 may include both opening areas and regions of layer 230 in any desired shape, size, and configuration. For example, opening 136 may include two smaller openings, 232 and 234, each having a substantially circular shape, as illustrated in FIG. 10 and FIG. 11. As an alternate example, opening 136 includes three substantially polygon-shaped openings 231, 233, and 235 surrounded by layer 230. Such a configuration is illustrated in FIG. 12 and FIG. 13. In one embodiment, embedded organic layer 230 circumscribes a periphery 237 of conductive terminal 116, as illustrated in FIGS. 11 and 13.

Figure 14:
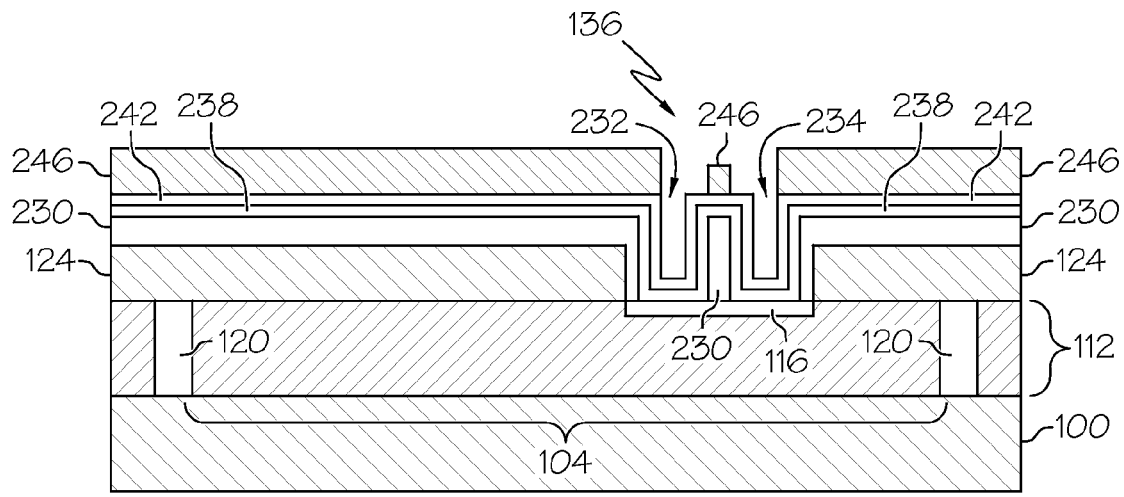

Next, a barrier layer 238 is blanket-deposited overlying the surface of die 104 including layer 230 and openings 232 and 234 (or openings 231, 233, and 235, or the like), as illustrated in FIG. 14. Barrier layer 238 may comprise any of the materials previously described with reference to barrier layer 162, and may be deposited similarly using a PVD or CVD process. A seed layer 242 then is blanket-deposited overlying barrier layer 238. Layer 242 may comprise any of the materials as previously described with reference to seed layer 166, and in a preferred embodiment comprises Cu. Next, a stress relief forming layer 246 is applied overlying seed layer 242, and is patterned lithographically. Layer 246 is a non-conducting layer having openings aligned with openings 232 and 234 (or openings 231, 233, and 235, or the like), and into which a stress relief layer is subsequently electroplated. Accordingly, when patterned, layer 246 covers layer 242 except for openings 232 and 234 (or openings 231, 233, and 235, or the like), within opening 136. Layer 246 may comprise a positive or negative acting photoresist and may have any suitable thickness that may depend upon overall design factors such as, for example, the width of opening 136 and/or the thickness of the subsequently formed stress relief layer. In one embodiment, layer 246 has a thickness of from about 100 nm to about 25 μm.

Figure 15:
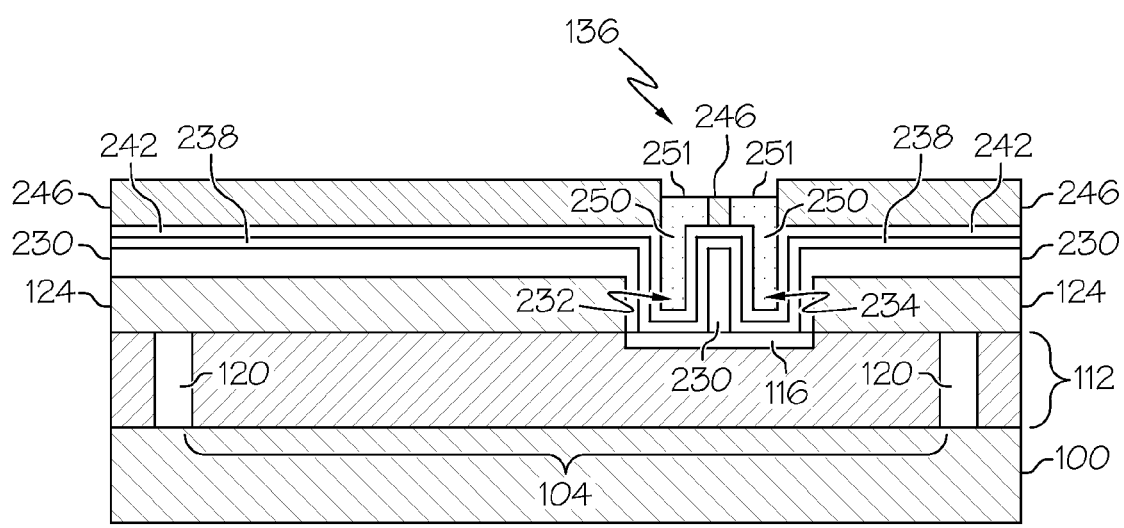

The process continues with the formation of a stress relief layer 250 within openings 232 and 234 (or openings 231, 233, and 235, or the like), as illustrated in FIG. 15. Layer 250 may be any of the materials previously described with reference to layer 178, and is formed in a similar manner using an electroplating process. Layer 250 has a thickness sufficient to provide stress relief between die 104 and a subsequently formed interconnecting structure. In one embodiment, layer 250 has a thickness such that an upper surface 251 thereof is substantially planar with the level of stress relief forming layer 246 within opening 136. Forming layer 246 then is removed using a solvent stripping and/or dry ashing process. Exposed barrier and seed layers 238 and 242 then are removed using a wet etch process previously described.

Figure 16:
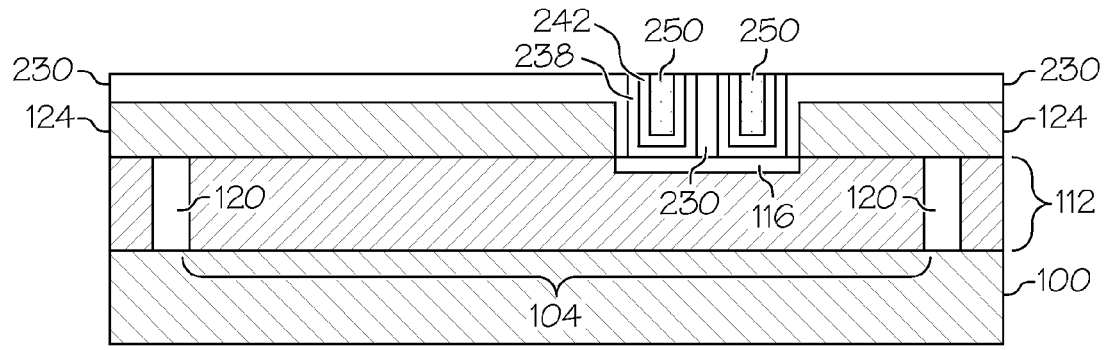
Figure 17:
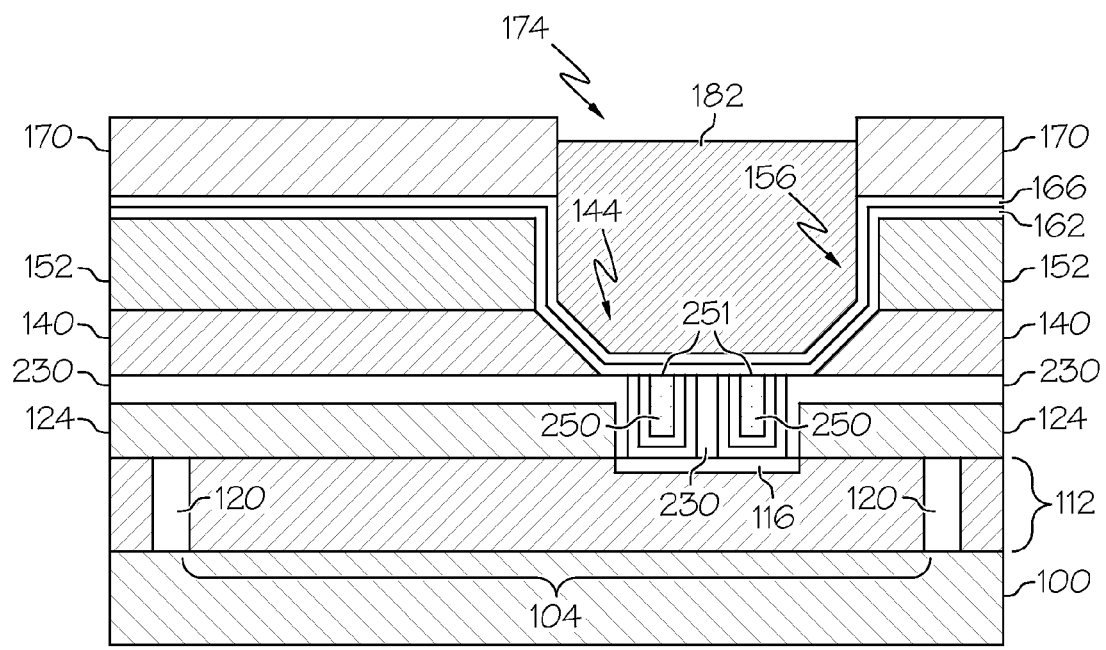

In one embodiment, following the removal of layers 238, 242, and 246, stress relief layer 250 is planarized using a chemical mechanical planarization (CMP) process, as illustrated in FIG. 16. Layer 250 may be planarized to any desired level such as, for example, planar with embedded organic layer 230 (as illustrated). Pillar forming layers 140 and 152 are sequentially applied overlying the surface of die 104, and are each patterned to form openings 144 and 156, respectively, each aligned to opening 136, as illustrated in FIG. 17. Barrier and seed layers 162 and 166 next are blanket-deposited overlying the surfaces of layer 152, the side surfaces within openings 156 and 144, and overlying embedded organic layer 230 and surface 251 of stress relief layer 250. Next, pillar forming masking layer 170 is applied overlying seed layer 166 and patterned to form opening 174 aligned to the openings 144 and 156. Pillar structure 182 is formed within opening 174 on seed layer 166 using an electroplating process previously described. Following plating of structure 182, layer 170 is removed and barrier and seed layers 162 and 166 are each removed from layer 152, but remain about structure 182.

Figure 18:
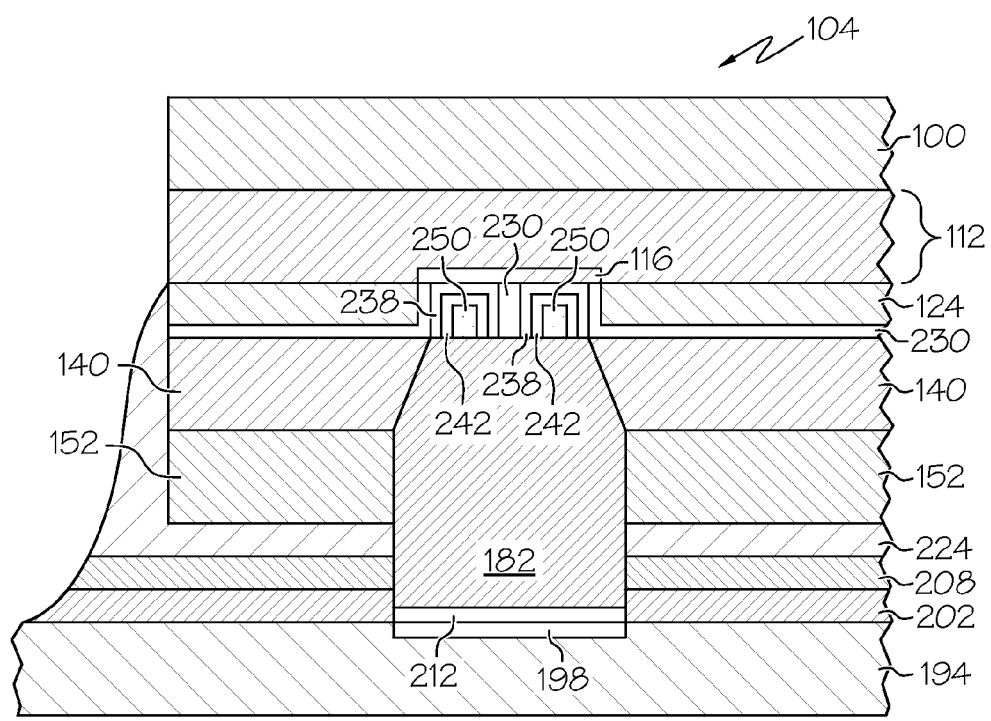

Next, packaging substrate 194, fabricated in a manner previously described and illustrated in FIGS. 7-8, is bonded to die 104 using a flip-chip bonding process, as illustrated in FIG. 18. Pillar structure 182 is aligned with conducting terminal 198 and solder-bonded thereto using heat to reflow stress relief layer 212. Underfilling sealant 224 then is dispensed between masking layer 208 and pillar forming layer 152 and cured to form an environmental seal for die 104, as previously described.

Figure 19:
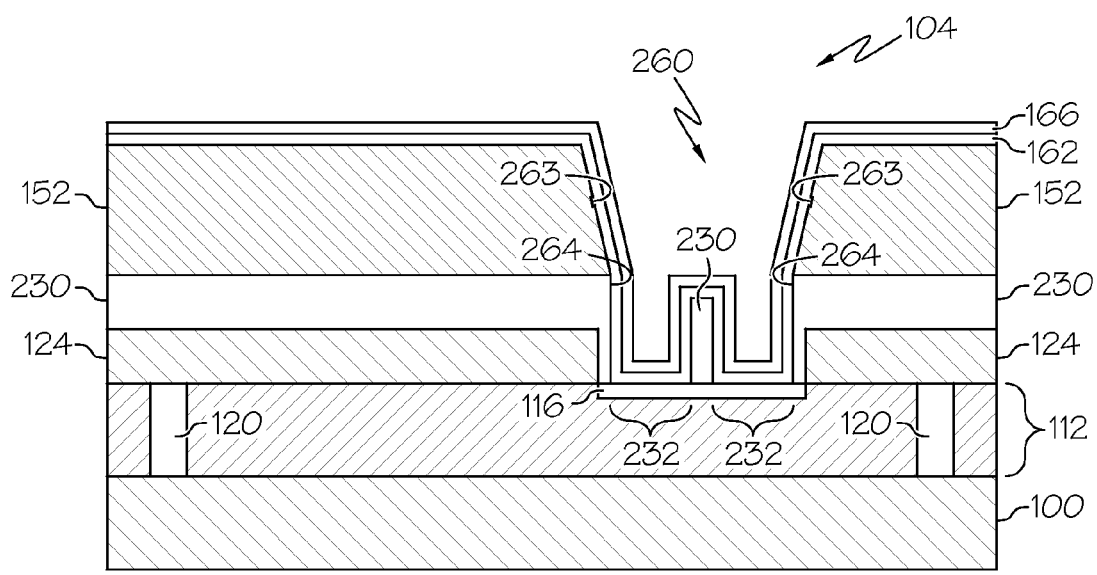
FIGS. 19-22, in conjunction with FIGS. 1-2 and FIGS. 10-11, illustrate schematically, in cross-section, a semiconductor device and methods for fabricating a semiconductor device having a stress relief layer in accordance with another exemplary embodiment.

In yet another exemplary embodiment illustrated in FIGS. 19-22 in conjunction with FIGS. 1-2 and FIGS. 10-11, a metallic stress relief layer is combined with an embedded patterned organic layer as a means of providing enhanced stress relief. This method begins with steps that are illustrated in FIGS. 1-2 and FIGS. 10-11, and previously described. Following the patterning of embedded organic layer 230 illustrated in FIGS. 10-11, pillar forming layer 152 is applied overlying the surface of layer 230 and is patterned to form an opening 260 aligned to terminal 116, as illustrated in FIG. 19. Next, barrier and seed layers 162 and 166 are blanket deposited in a manner previously described. These layers are formed overlying exposed surfaces of die 104 including layer 152 and side surfaces 263 and 264 of layer 152 and embedded organic layer 230, respectively. Layers 162 and 166 are also formed overlying conductive terminal 116 in openings 232 and 234, and embedded organic layer 230.

Figure 20:
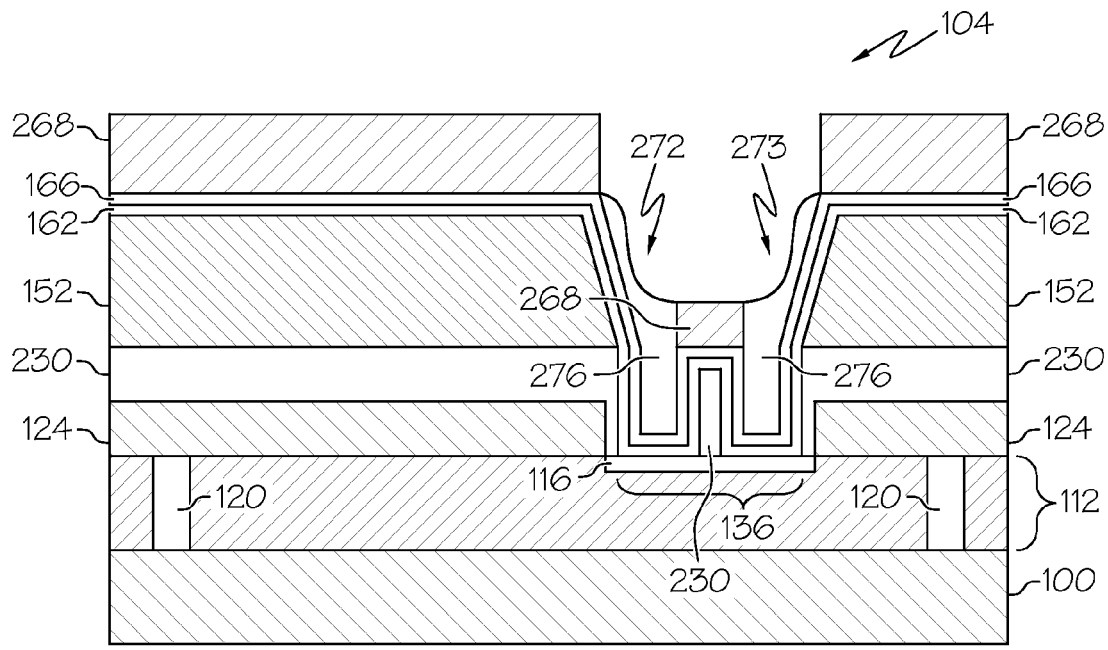

Next, a masking layer 268 is applied overlying layer 152 and is patterned in a manner which mimics the patterns previously formed in embedded organic layer 230 in regions overlying conductive terminal 116, as illustrated in FIG. 20. Layer 268 may be patterned using a lithography process previously described with reference to stress relief forming layer 246, and illustrated in FIG. 15. Masking layer 268 provides a non-conducting layer that prevents the deposition of metal during a subsequent electroplating process on exposed surfaces of die 104 except those overlying conductive terminal 116 whereon it is desirable to electroplate a stress relief layer. That is, layer 268 overlies patterned features of layer 230 within the region overlying terminal 116, and forms openings 272 and 273 between these features. A stress relief layer 276 is formed within openings 272 and 273 using an electroplating process as previously described with reference to layer 250, and illustrated in FIG. 15. Layer 276 forms around patterned features within embedded organic layer 230, and has a thickness sufficient for absorbing stress between die 104 and packaging substrate 194 (FIG. 18). This thickness will depend, at least in part, on the size of other features such as, for example, that of opening 136, and the material chosen for layer 276. For example, layer 276 can have a thickness of from about 50 nm to about 5 µm. In a preferred embodiment, layer 276 is plated so as to be planar with layer 268 (as illustrated). Masking layer 268 then is removed.

Figure 21:
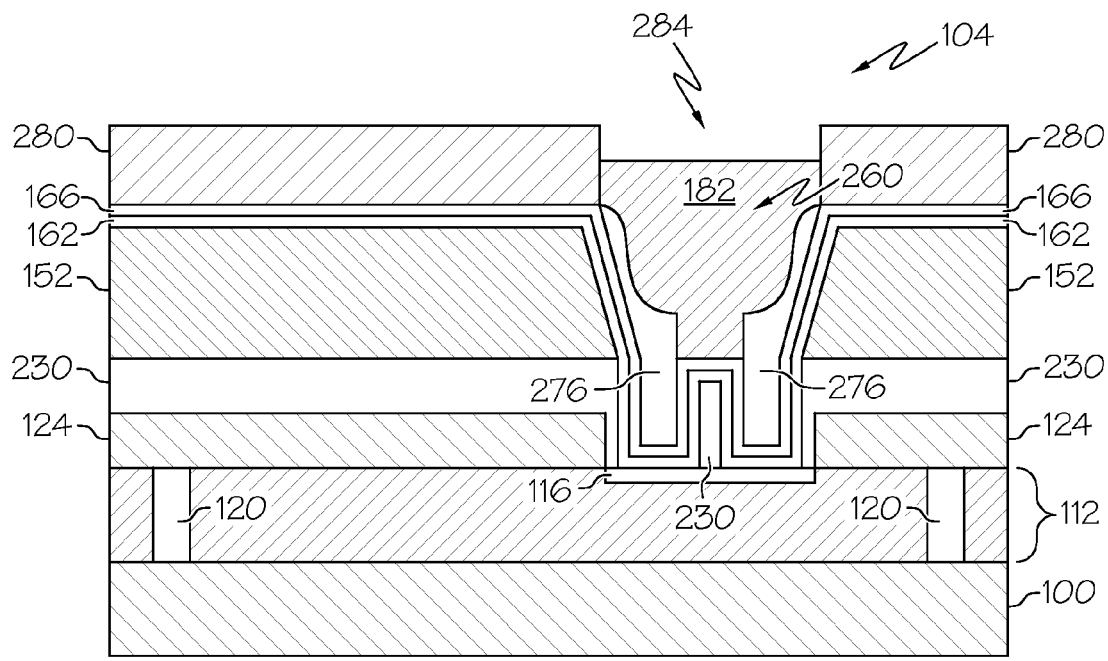

The process continues with the formation of a thick masking layer 280 formed overlying seed layer 166, as illustrated in FIG. 21. Layer 280 is formed as previously described with reference to layer 170, and is patterned to form an opening 284 aligned to conductive terminal 116 and opening 260 in layer 152. Next, pillar structure 182 is formed within opening 284 using an electroplating process as previously described. Following the formation of structure 182, thick masking layer 280 is removed and barrier and seed layers 162 and 166 are each removed from layer 152, but remain adjacent structure 182.

Figure 22:
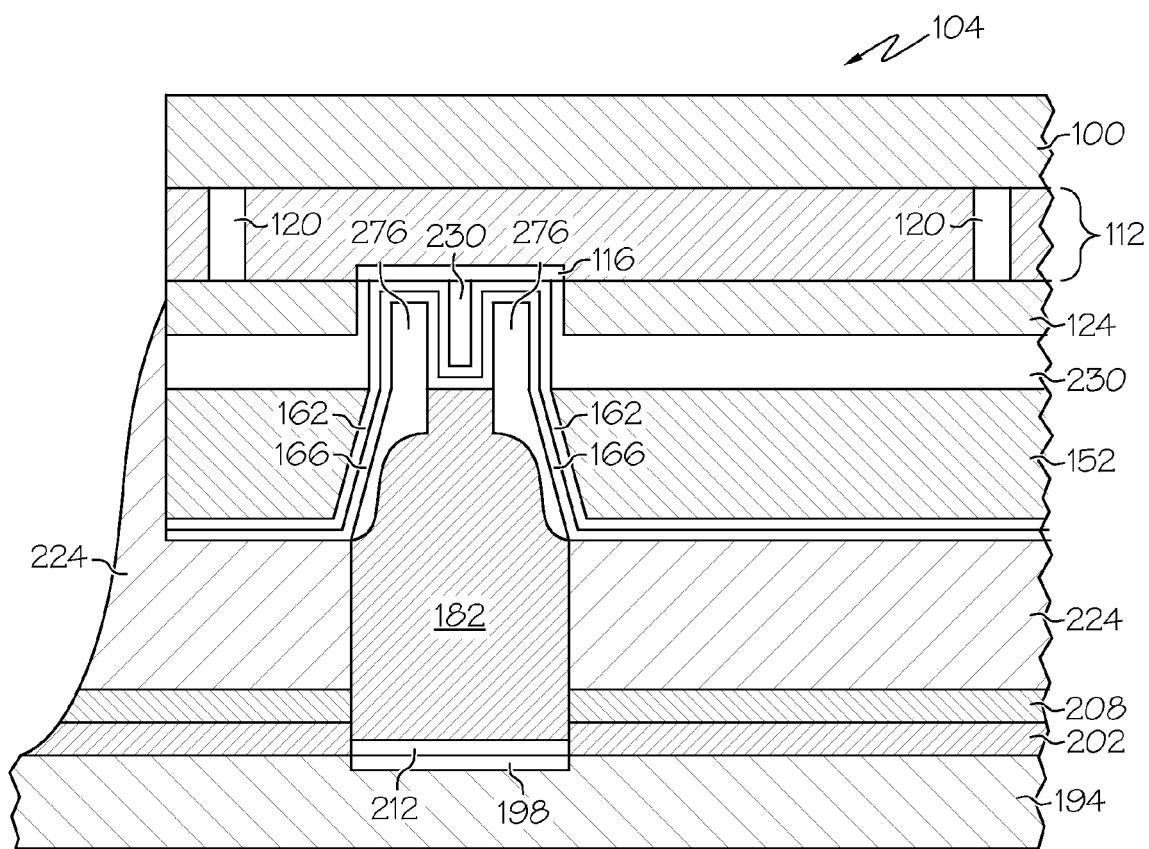

A flip-chip process as previously described then is performed to join pillar structure 182 to conductive terminal 198 of packaging substrate 194, as illustrated in FIG. 22. Die 104 is inverted and structure 182 is aligned with terminal 198 and solder-bonded thereto. Underfilling sealant 224 is infused between substrate 194 and pillar forming layer 152, and is cured to form an environmentally resistant coating that seals the surface of die 104.

Accordingly, the embodiments described herein provide novel methods for fabricating semiconductor devices having stress relief layers. A first stress relief layer is disposed between a conducting terminal within a die and a first end of a copper interconnecting pillar used to electrically connect the terminal to a packaging substrate. The stress relief layer is made of a metallic conductor characterized by having greater ductility than pure copper. Because of its higher ductility, the stress relief layer can absorb additional shearing stress between the die and the packaging substrate that might otherwise fracture the die/package interconnection and/or cause cracking in other more brittle BEOL layers within the die. In other embodiments, the stress relief layer may be patterned and embedded into a surrounding organic layer to further enhance stress absorption. In further embodiments, a second stress relief layer is included between a conducting terminal of the packaging substrate and a second end of the interconnecting pillar. This configuration provides additional capacity for stress absorption by positioning stress relieving layers at either ends of the pillar. Accordingly, these methods may be integrated into a conventional fabrication sequence to improve the reliability of such devices.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method of fabricating a semiconductor device comprising the steps of:
   providing a semiconductor die having a conductive terminal;
   forming an insulating layer overlying the semiconductor die;
   forming a cavity in the insulating layer which exposes the conductive terminal;
   forming a first stress-relief layer in the cavity;
   forming an interconnecting structure having a first end electrically coupled to the first stress-relief layer, and having a second end;
   forming a second stress-relief layer interposed between the second end of the interconnecting structure and a packaging substrate; and electrically and physically coupling the second end of the interconnecting structure to the packaging substrate.

2. The method of claim 1, further comprising the step of dicing the semiconductor die from a semiconductor substrate after the step of forming a first stress-relief layer.

3. The method of claim 2, wherein the step of dicing the semiconductor die is performed after the step of forming a second stress-relief layer.

4. The method of claim 1, wherein the step of forming a first stress-relief layer comprises forming a first stress-relief layer having a shear modulus less than that of substantially pure copper.

5. The method of claim 1, wherein the step of forming a first stress-relief layer comprises forming a first stress-relief layer formed of a material selected from a group consisting of Sn, Ag, In, Bi, Cu, Pb, Au, Ni, Mg, Al, and alloys thereof.

6. The method of claim 1, wherein the step of forming an interconnecting structure comprises forming a copper interconnecting structure.

7. The method of claim 1, wherein the step of forming a first stress-relief layer comprises forming a first stress-relief layer by electroplating.

8. The method of claim 1, further comprising the step of forming a patterned first stress-relief layer.

9. The method of claim 1, further comprising the step of planarizing the first stress-relief layer.

10. The method of claim 1, further comprising the step of forming a patterned organic layer on the conductive terminal before forming the first stress-relief layer.

11. The method of claim 10, wherein the step of forming a patterned organic layer is performed after the step of forming a first stress-relief layer.

12. A method of fabricating a semiconductor device comprising the steps of:
providing a semiconductor die having a first conductive terminal;
providing a packaging substrate having a second conductive terminal;
forming a first stress-relief layer in electrical communication with the first conductive terminal;
forming an interconnecting structure having a first end coupled to the first stress-relief layer, and having a second end;
forming a second stress-relief layer on the second conductive terminal; and
electrically and physically coupling the second stress-relief layer to the second end of the interconnecting structure.

13. The method of claim 12, further comprising the step of forming an organic layer having an opening on the first conductive terminal.

14. The method of claim 13, wherein the step of forming a first stress-relief layer comprises forming a first stress-relief layer in the opening.

15. The method of claim 13, further comprising the step of depositing a seed layer on the first conductive terminal prior to the step of forming a first stress-relief layer and after the step of forming an organic layer.

16. The method of claim 13, wherein the step of forming an organic layer comprises forming an organic layer that circumscribes the periphery of the first conductive terminal.

17. The method of claim 13, wherein the step of forming an organic layer having an opening comprises forming an organic layer having a substantially polygon-shaped opening.

18. The method of claim 13, wherein the step of forming an organic layer having an opening comprises forming an organic layer having a substantially circular opening.

19. An electronic device comprising:
a packaging substrate;
a semiconductor die having a conductive terminal;
a first stress-relief layer in electrical communication with the conductive terminal; and
an interconnecting structure having a first end electrically and physically coupled to the first stress-relief layer, and having a second end electrically and physically coupled to the packaging substrate, wherein a second stress-relief layer is interposed between the second end of the interconnecting structure and the packaging substrate.

* * * * *